United States Patent [19]

Imai et al.

[11] Patent Number: 5,598,030
[45] Date of Patent: Jan. 28, 1997

[54] SEMICONDUCTOR DEVICE HAVING MULTILEVEL TAB LEADS

[75] Inventors: Shin-ichi Imai, Yokohama; Katsuji Fujita, Ooita, both of Japan

[73] Assignee: Kabushiki Kaisha Toshiba, Kawasaki, Japan

[21] Appl. No.: 546,826

[22] Filed: Oct. 23, 1995

Related U.S. Application Data

[63] Continuation of Ser. No. 377,486, Jan. 24, 1995, abandoned, which is a continuation of Ser. No. 63,657, May 20, 1993, abandoned.

[30] Foreign Application Priority Data

May 21, 1992 [JP] Japan ..................................... 4-128996

[51] Int. Cl.⁶ .......................... H01L 23/495; H01L 23/02
[52] U.S. Cl. .......................... 257/666; 257/668; 257/672; 257/676
[58] Field of Search .................................... 257/666, 668, 257/672, 673, 676, 688, 692, 693, 694, 695, 698, 700, 735, 736, 788, 750, 787, 773, 781

[56] References Cited

U.S. PATENT DOCUMENTS

H1,267  12/1993  Boyd .................................... 257/666

FOREIGN PATENT DOCUMENTS 2310956  12/1990  Japan .................................... 257/666

Primary Examiner—Carl Whitehead, Jr.
Attorney, Agent, or Firm—Finnegan, Henderson, Farabow, Garrett & Dunner, L.L.P.

[57] ABSTRACT

A TAB film comprises a resin film and a plurality of leads provided on the resin film to extend from a side of the resin film, each of the plurality of leads having a bonding portion at an end portion, the plurality of leads providing a plurality of multilevel structure for every adjacent two leads at an extended portion extending from the side of the resin film so as to expose the bonding portion of each of the adjacent two leads.

14 Claims, 3 Drawing Sheets

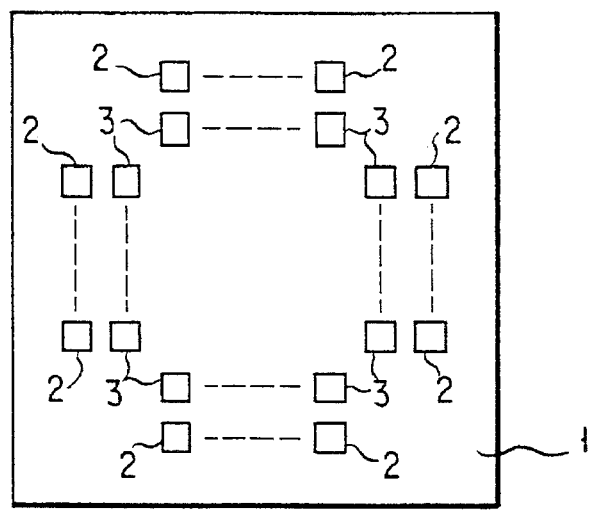
F I G. 1
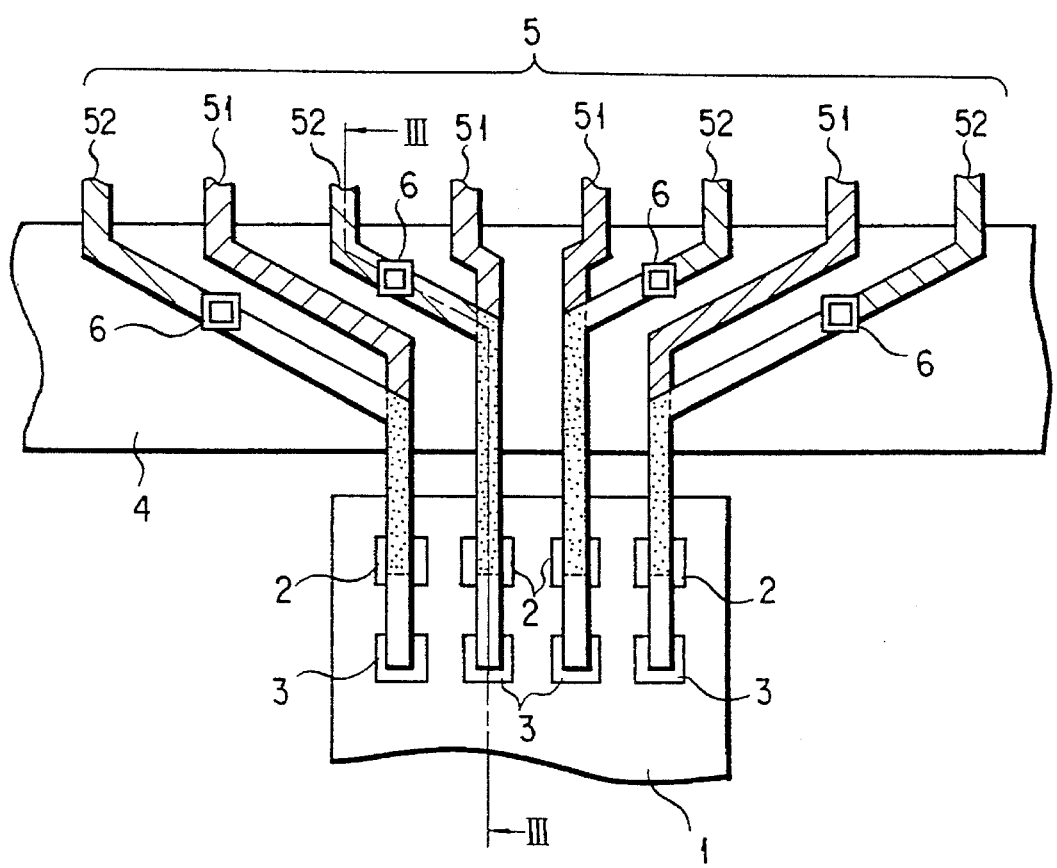
F I G. 2

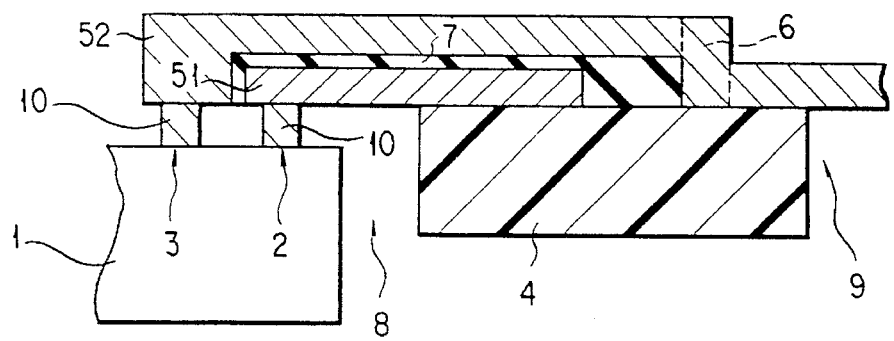
F I G. 3A
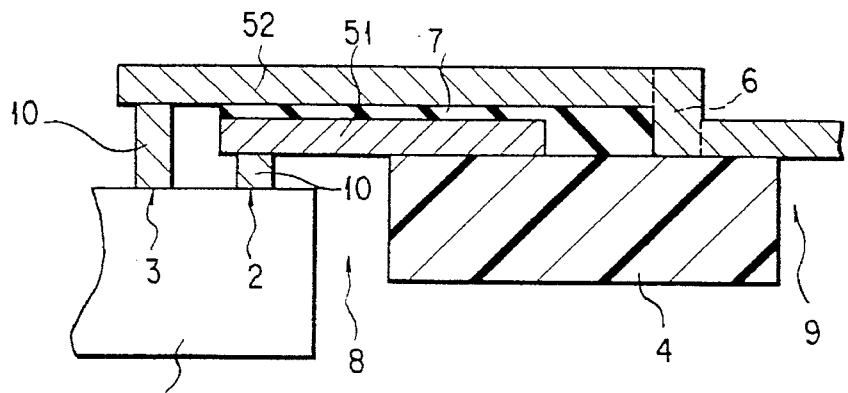
F I G. 3B

SEMICONDUCTOR DEVICE HAVING MULTILEVEL TAB LEADS

This application is a continuation of application Ser. No. 08/377,486, filed Jan. 24, 1995, now abandoned, which is a continuation of application Ser. No. 08/063,657, filed May 20, 1993, now abandoned.

BACKGROUND OF THE INVENTION

1. Field of the Invention

The present invention relates to a technique of mounting a semiconductor chip on a semiconductor device, and more particularly to a technique of mounting a semiconductor chip on a TAB (Tape Automated Bonding) film.

2. Description of the Related Art

As integration density and functions of internal elements of a semiconductor chip have been increased, a semiconductor device package inevitably has a great number of pins. A TCP (Tape Carrier Package) is known as a package having a number of pins which is applicable to a LCD (Liquid Crystal Display) driver or an ASIC.

FIG. 4 shows a TAB film 20. The TAB film 20 includes a resin film 21, sprocket holes 22, a device hole 23 through which a semiconductor chip 30 is inserted, outer lead holes 24, a plurality of leads 25, and test pads 26 respectively connected to the leads 25.

FIGS. 5A and 5B show connection between the semiconductor chip 30 and the leads 25. As shown in FIG. 5A, an end portion (inner lead) 25a of the lead 25 is connected to a bump 32 formed on a pad 31 of the semiconductor chip 30. As shown in FIG. 5B, the leads 25 arranged in one line are respectively connected to the pads 31 arranged in one line.

In the above-described TAB film, a pad pitch l (shown in FIG. 5B) can be as small as 80 μm according to the current practical technique. Since technique of forming more miniaturized inner elements of a semiconductor chip progresses more rapidly as compared to technique of mounting the semiconductor chip, the size of a semiconductor chip is determined by the number of pads. In other words, although internal elements of a semiconductor chip can be finer, a semiconductor chip cannot be so fine in accordance with the size of the elements. Therefore, the chip may include large dead space.

A semiconductor chip can be much smaller if two lines of pads are formed along one side of the chip. However, the conventional TAB mounting technique cannot mount a semiconductor chip having two lines of pads along one side thereof on a device.

As described above, the technique of mounting a semiconductor chip on a TAB film inhibits miniaturization of a chip.

SUMMARY OF THE INVENTION

An object of the present invention is to provide a TAB film suitable for mounting a semiconductor chip having a plurality of lines of pads along one side thereof.

Another object of the present invention is to provide a semiconductor device on which a semiconductor chip is mounted on the above-mentioned TAB film.

According to an aspect of the present invention, there is provided a TAB film comprising a resin film, a plurality of leads formed on the resin film to extend from a side of the resin film, each of the plurality of leads having a bonding portion at an end portion thereof, the plurality of leads providing a plurality of multilevel structure for every adjacent two leads at an extended portion extending from the side of the resin film so as to expose the bonding portion of each of adjacent two leads.

A semiconductor device comprises the TAB film and a semiconductor chip having first and second groups of pads arranged in two lines at a periphery thereof, wherein the first group of the pads are nearer one side of the semiconductor chip, the second group of the pads are arranged on part of the semiconductor chip to the inside of the first group, the first lead is connected through the bonding portion to each of the first group of the pads, the second lead is connected through the bonding portion to each of the second group of pads.

BRIEF DESCRIPTION OF THE DRAWINGS

The novel and distinctive features of the invention are set forth in the claims appended to the present application.

The invention itself, however, together with further objects and advantages thereof may best be understood by reference to the following description and accompanying drawings in which:

FIG. 1 is a schematic plan view showing a semiconductor chip having pad groups each consisting of a plurality of lines;

FIG. 2 is a schematic plan view showing a state wherein a semiconductor chip is mounted on a TAB film according to the present invention;

FIG. 3A is a schematic cross sectional view showing a shape of an end portion of a lead, taken along the line III—III in FIG. 2;

FIG. 3B is a schematic cross sectional view showing a modification of the shape of the end portion of the lead shown in FIG. 3A;

DETAILED DESCRIPTION OF THE PREFERRED EMBODIMENTS

Figure 4:
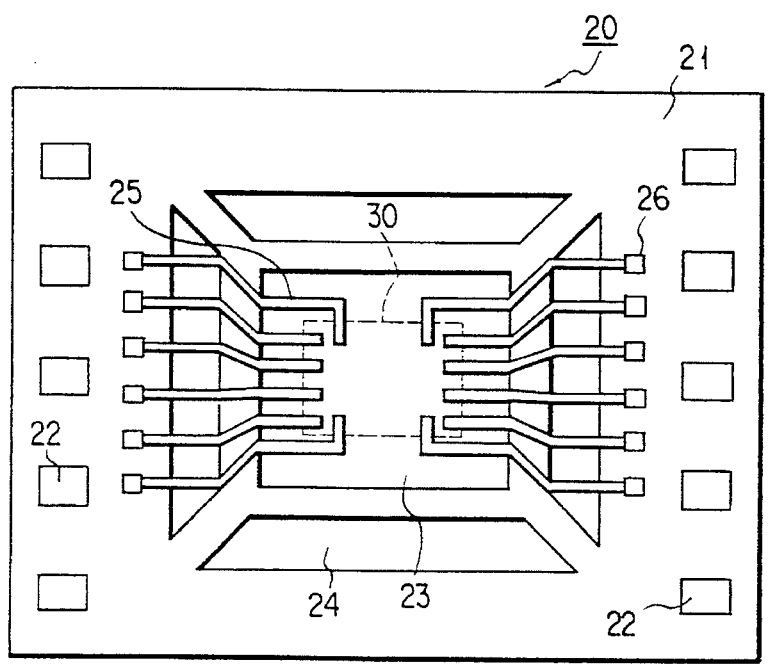
FIG. 4 is a schematic plan view showing a conventional TAB film.
Figure 5A:
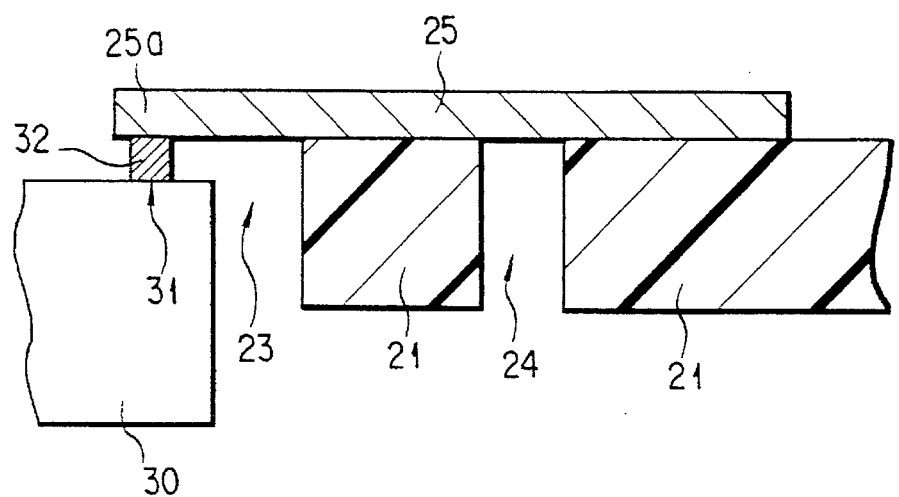
FIG. 5A is a schematic cross sectional view showing a state where a semiconductor chip is mounted on the conventional TAB film.
Figure 5B:
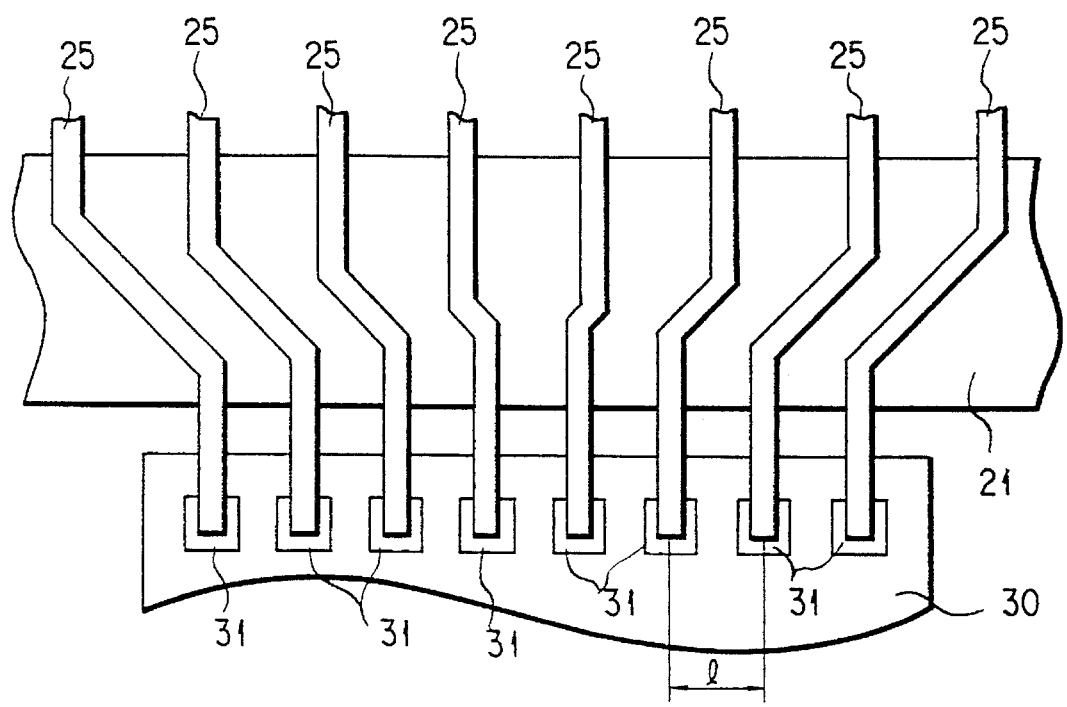
FIG. 5B is a schematic plan view showing a state where a semiconductor chip is mounted on the conventional TAB film.

An embodiment of the present invention will be described with reference to the accompanying drawings. As shown in FIG. 1, pads are arranged in two lines along each side of a semiconductor chip 1. More specifically, pads 2 of a first group are arranged along the four sides of the chip and pads 3 of a second group are arranged on part of the chip to the inside of the first group. On each side, corresponding pads 2 and 3 are arranged in a direction perpendicular to the side.

Referring to FIG. 2, a TAB film of the present invention and a semiconductor device in which the semiconductor chip 1 is mounted on the TAB film will be described. The TAB film comprises a resin film 4 and a lead group 5 consisting of leads 51 and 52. The leads 51 and 52, adjacent to each other, form a multilevel structure. In FIG. 2, slant line portions of the lead group 5 are formed directly on the resin film 4, and the leads 52 are stacked on the lead 51 in dot portions. A portion of the lead 52 defined by a through hole 6 and a film side end thereof (a first layer) is formed directly on the resin film 4 and the other portion of the lead 52 (a second layer) is formed on an interlayer material (not shown). In other words, film side end portions of the lead group 5 (outer lead) are formed on the same plane and adjacent leads (51 and 52) in a chip side end portion of the lead group 5 (inner lead) form a multilevel structure. The leads 51 are connected to the pads 2 and the leads 52 are connected to the pads 3.

The lead group 5 (51, 52) will be described in detail with reference to FIG. 3A. The leads 51 and 52 are insulated from each other by an interlayer material 7. The lead 52 overlaps the lead 51 at a portion between a device hole 8 and an outer lead hole 9 on the resin film 4. The chip side end portion of the lead 52 covers the chip side end portion of the lead 51. Bumps 10 of the same height are formed on the first and second pads 2 and 3. The leads 51 and 52 are respectively connected to the first and second pads 2 and 3 through the bump 10.

FIG. 3B shows another example of the chip side end portions of the leads 51 and 52. The lead 52 protrudes from the end of the lead 51, toward the central portion of the semiconductor chip 1. The chip side end portions of the leads 51 and 52 are formed on different planes. The bump 10 formed on the second pad 3 is taller than the bump formed on the first pad 2.

Needless to say, the leads are not limited to the two-layered structure, but can be a three-layered structure. As the number of lead layers increases, a TAB film applicable to a finer semiconductor chip can be provided.

When, for example, a semiconductor chip having 300 pads (along the four sides) arranged at pad pitch of 80 μm is mounted on the conventional TAB film, one side of the semiconductor chip cannot be smaller than about 6.0 mm. In contrast, when the same semiconductor chip is mounted on the TAB film of the present invention, one side of the semiconductor chip can be as small as about 3.1 mm. Thus, according to the present invention, since chip side end portions of the leads are multilayered, it is possible to use a semiconductor chip having a plurality of lines of pads arranged along one side thereof, thereby enabling reduction in size of a semiconductor chip.

It is further understood by those skilled in the art that the foregoing description is preferred embodiments and that various changes and modifications may be made without departing from the spirit and scope thereof.

What is claimed is:

1. A TAB film for semiconductor integrated circuit devices comprising:

a resin film having a surface and at least two edge portions; and a plurality of leads partly engaged with said resin film, each of said plurality of leads having outer lead portions extending beyond one of said two edge portions and inner lead portions provided on said resin film to be electrically connected to bonding pads of a semiconductor chip at tips dedicated to said inner lead portions, said tips extending beyond the other of said two edge portions, at least two of said inner lead portions of said leads adjacent to each other lie in a first section and a second section on said, resin film, said first section being on a side of said outer lead portion and said second section being on a side of said semiconductor chip, each of said adjacent leads of said first section being spaced from one another and physically engaged with said surface of said resin film, said adjacent leads of said second section being stacked one over the other on said resin film along a length of said adjacent leads so as to be electrically insulated from each other, one of said adjacent leads of said second section covering a substantial portion of the other of said adjacent leads of said second section.

2. The TAB film according to claim 1, wherein one of said inner lead portions of said second section covers the other of said inner lead portions of said second section completely to provide a multilevel structure.

3. The TAB film according to claim 2, wherein said at least two inner lead portions of said second section have an insulating film between said at least two inner lead portions.

4. The TAB film according to claim 1, wherein said adjacent leads of said second section extend towards said semiconductor chip.

5. The TAB film according to claim 1, wherein said resin film has a device hole for inserting said semiconductor chip and outer lead holes disposed at a periphery of said device hole.

6. A semiconductor device comprising:

a semiconductor chip including first and second groups of pads arranged in first and second rows at a periphery thereof; and a TAB film including a resin film having a surface and at least two edge portions and a plurality of leads partly engaged with said resin film, each of said plurality of leads having outer lead portions extending beyond one of said two edge portions and inner lead portions provided on said resin film to be electrically connected to bonding pads of said semiconductor chip at tips dedicated to said inner lead portions, said tips extending beyond the other of said two edge portions, at least two inner lead portions of said leads adjacent to each other lie in a first section and a second section on said resin film, said first section being on a side of said outer lead portions and said second section being on a side of said semiconductor chip, each of said adjacent inner lead portions of said first section being spaced from one another and physically engaged with said surface of said resin film, said adjacent inner lead portions of said second section being stacked one over the other on said resin film along a length of said adjacent leads so as to be electrically insulated from each other, one of said adjacent leads of said second section covering a substantial portion of the other of said adjacent leads of said second section;

said first inner lead portions of said second section being electrically connected to one of said pads in said first group in said first row, and said second inner lead portions of said second section being electrically connected to one of said pads in said second group in said second row.

7. The semiconductor device according to claim 6, wherein said first group of pads is arranged inside the second group of pads.

8. The semiconductor device according to claim 6, wherein one of said first and second inner lead portions of said second section covers the other of said first and second inner lead portions of said second section completely to provide a multilevel structure.

9. The semiconductor device according to claim 8, wherein said first inner lead portion of said second section is arranged just under said second inner lead portion of said second section.

10. The TAB film according to claim 1, wherein said surface of said resin film is a planar surface for receiving said leads and said adjacent leads of said first section are in a common plane and attached to said planar surface of said resin film.

11. The TAB film according to claim 10, wherein said adjacent leads of said second section are in different respective planes, said plane of said second section being parallel to said planar surface of said resin film.

12. The semiconductor device according to claim 6, wherein said surface of said resin film is a planar surface for receiving said leads and said first and second inner lead portions of said first section are in a common plane and attached to said planar surface of said resin film.

13. The semiconductor device according to claim 12, wherein said first and second inner lead portions of said second section are in different respective planes, said respective planes of said second section being parallel to said planar surface of said resin film.

14. A TAB film for semiconductor integrated circuit devices comprising:

a single resin film; and a plurality of leads supported by said single resin film in one plane and insulated from one another, said leads having chip end portions extending from one edge of said film for connecting to bonding pads of a semiconductor chip, and outer lead portions extending from another edge of said film opposite said one edge, wherein at least two adjacent leads of said chip end portions are stacked one over the other along a length of said adjacent leads and electrically insulated from each other to provide a multilevel structure so that an upper-stacked one of said chip end portions has a greater length from said one edge of said film than a length of a lower-stacked one of said chip end portions to expose all tips of said chip end portions for bonding, and said outer lead portions are spaced from one another and physically engaged with said single resin film.

* * * * *